United States Patent [19]

Merchant et al.

[11] Patent Number: 5,489,552
[45] Date of Patent: Feb. 6, 1996

[54] MULTIPLE LAYER TUNGSTEN DEPOSITION PROCESS

[75] Inventors: Sailesh M. Merchant, Orlando, Fla.; Arun K. Nanda, Austin, Tex.; Pradip K. Roy, Orlando, Fla.

[73] Assignee: AT&T Corp., Murray Hill, N.J.

[21] Appl. No.: 366,529

[22] Filed: Dec. 30, 1994

[51] Int. Cl.⁶ .......................... H01L 21/44; H01L 21/443
[52] U.S. Cl. .......................................................... 437/192
[58] Field of Search .................................... 437/192, 246, 437/245

[56] References Cited

U.S. PATENT DOCUMENTS

| | | | |
|---|---|---|---|
| 4,532,702 | 8/1985 | Gigante et al. | 29/578 |
| 4,629,635 | 12/1986 | Brors | 427/255.2 |
| 4,804,560 | 2/1989 | Shioya et al. | 427/125 |
| 4,849,260 | 7/1989 | Kusumoto et al. | 427/250 |
| 4,874,719 | 10/1989 | Kurosawa | 437/195 |
| 4,985,371 | 1/1991 | Rana et al. | 437/189 |
| 5,108,952 | 4/1992 | Matsuhashi | 437/192 |
| 5,143,861 | 9/1992 | Turner. | |
| 5,164,330 | 11/1992 | Davis et al.. | |
| 5,183,782 | 2/1993 | Onishi et al.. | |
| 5,200,360 | 4/1993 | Bradbury et al.. | |
| 5,202,579 | 4/1993 | Fujii et al.. | |
| 5,232,873 | 8/1993 | Geva et al.. | |
| 5,233,223 | 8/1993 | Murayama. | |
| 5,244,534 | 9/1993 | Yu et al.. | |
| 5,260,232 | 11/1993 | Muroyama et al.. | |
| 5,272,112 | 12/1993 | Schmitz et al. | 437/192 |
| 5,312,775 | 5/1994 | Fujii et al.. | |
| 5,327,011 | 7/1994 | Iwamatsu. | |
| 5,407,698 | 4/1995 | Emesh | 427/99 |

FOREIGN PATENT DOCUMENTS

| | | | |
|---|---|---|---|
| 1160011 | 6/1989 | Japan | H01L 21/285 |
| 2199827 | 8/1990 | Japan | H01L 21/285 |
| 3060126 | 3/1991 | Japan | H01L 21/325 |
| 5003170 | 1/1993 | Japan | H01L 21/28 |
| 5152292 | 6/1993 | Japan | H01L 21/325 |

OTHER PUBLICATIONS

"High Pressure Blanket CVD Tungsten", Thomas Clark et al., Mat. Res. Soc. Symp. Proc. VLSI V, 1990 Material Research Society.

*Primary Examiner*—R. Bruce Breneman
*Assistant Examiner*—Matthew Whipple

[57] ABSTRACT

Tungsten plugs are formed in a manner which avoids the formation of unwanted tungsten volcanoes by depositing at least three and preferably five to seven layers of tungsten within a contact hole to form a layered plug. In particularly useful embodiments, the layers are deposited at alternating fast and slow rates of deposition.

18 Claims, 3 Drawing Sheets

MULTIPLE LAYER TUNGSTEN DEPOSITION PROCESS

BACKGROUND

1. Technical Field

This disclosure relates generally to the manufacture of semiconductor devices having a multilayer interconnection structure. More specifically, this disclosure relates to novel methods of making layered tungsten plugs in such devices.

2. Background of Related Art

In the manufacture of a conventional tungsten plug or stud, a substrate 101 has a contact hole 110 formed therein as shown in FIG. 1A. A titanium layer 112 and a titanium nitride layer 114 are sequentially deposited on the substrate. Near the top edge 115 of contact hole 110, layers 112 and 114 are normally quite thin. Tungsten is then deposited, for example via chemical vapor deposition (CVD), to fill contact hole 110. Depending on the position of the substrate within the device, the structure shown in FIG. 1A can be used to produce a tungsten plug at the window level or a tungsten plug at the via level.

Tungsten is normally deposited in a single step during formation of a conventional tungsten plug. The stress in the resulting conventional tungsten film is high, usually >E10 tensile. Such high stress may result in peeling of the tungsten film and the TiN layer on which the tungsten is deposited. Alternatively, ripples and/or cracks may form in the TiN layer, making the device subject to chemical attack during subsequent manufacturing steps and reducing the long term reliability of the device.

Additionally, tungsten deposition by CVD involves the use of tungsten hexafluoride, and subjects the coated substrate to fluorine and hydrofluoric acid. Diffusion of fluorine gas through pinhole defects in titanium nitride layer 114 causes excessive tungsten growth at the location of the defect.

Specifically, as shown in FIG. 1B, rupture in titanium nitride layer 114 may occur, particularly at the top edge 115 of contact hole 110. Where such ruptures occur, volcanoes 125 are formed which are areas of thick tungsten growth compared to tungsten layer produced within the contact hole 110 and the portion 122 of the tungsten layer produced on the surface of the substrate 101. Hole 110 may not be completely filled with tungsten if growth is sufficiently rapid to cover the opening of the contact hole and thereby partially or completely block any further tungsten deposition within the hole. However, even where the contact hole is completely filled by a tungsten plug 130, a large tungsten growth 126 is formed, the thickness of which far exceeds the thickness of the portion 122 of the tungsten layer on the surface of substrate 101, as shown in FIG. 1C. Ultimately, the device may have to be discarded due to the presence of the volcanoes. Where it is possible to salvage the device, additional steps must be taken to remove growth 126 from the surface of the device, adding to the cost of producing the device.

It would be desirable to provide a tungsten plug by a method which deposits tungsten with a controlled microstructure to reduce stress within the deposited tungsten. It also would be desirable to provide a tungsten plug by a method which does not produce volcanoes or undesired tungsten growths on the surface of the device.

SUMMARY

Novel techniques for forming layered tungsten plugs are disclosed herein which reduce internal stresses within the tungsten and avoid the formation of volcanoes and unwanted, excessive tungsten growths on the surface of the substrate.

According to the via filling process disclosed herein, tungsten is deposited in layers within a contact hole. At least three and preferably five to seven discrete growth phases are employed to at least substantially fill the contact hole. The growth phases are separated by periods during which substantially no tungsten deposition occurs. In particularly useful embodiments, the sequential tungsten deposition phases are conducted at conditions which provide alternating fast and slow rates of deposition. Preferably, tungsten is deposited via hydrogen reduction of tungsten hexafluoride and the fast rates of deposition are greater than 40 Å/second and the slow rates of deposition are less than 40 Å/second.

The deposition sequence of the methods disclosed herein results in interrupted growth of tungsten, creating virtual interfaces between each layer of tungsten deposited. This interrupted growth produces a coherent interface between the layers of tungsten, therefore minimizing internal strains. Depositing the tungsten in layers also accommodates stress in the tungsten film (usually >1E10 tensile in conventional deposits). Interrupted growth during tungsten deposition allows stress reduction and defect forming conditions are not as severe as seen with conventional depositions. In addition, in accordance with the methods disclosed herein, layered structures are artificially modulated to achieve superior nucleation and growth characteristics over conventionally deposited materials. Therefore, the tungsten plugs produced in accordance with this disclosure are defect-free, exhibit lower intrinsic stress and shown improved adhesion and mechanical properties.

BRIEF DESCRIPTION OF THE DRAWINGS

Various embodiments are described herein with reference to the drawings, wherein.

DETAILED DESCRIPTION OF PREFERRED EMBODIMENTS

Figure 1A:
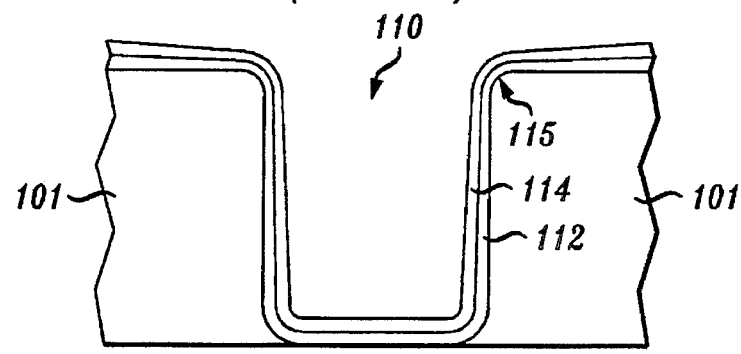
FIGS. 1A–1C are schematic representations of structures at various stages during the formulation of tungsten plugs (either at the window level or at the via level) using conventional, prior art techniques.
Figure 1B:
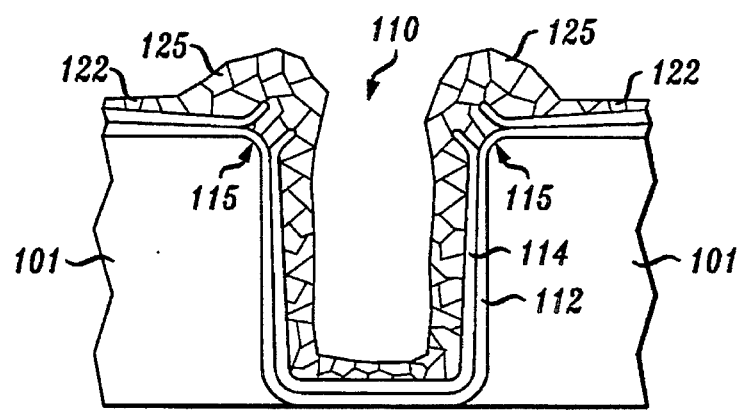
Figure 1C:
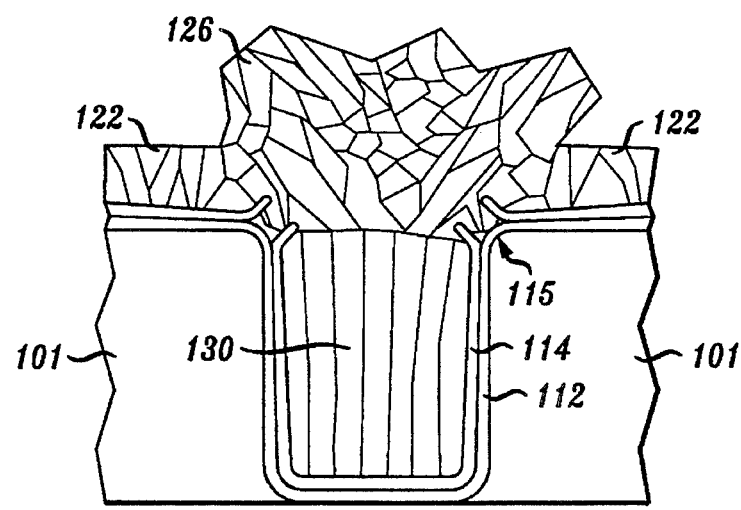
Figure 2:
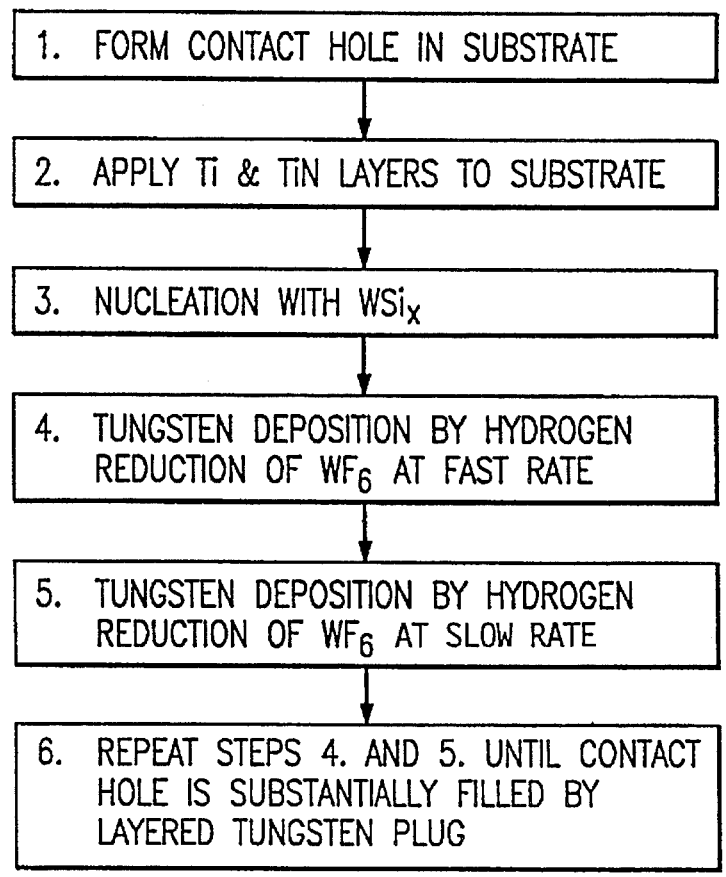
FIG. 2 is a flow diagram showing the steps for forming a tungsten plug (at the window or via level) in accordance with a method disclosed herein.

FIG. 2 is a flow diagram summarizing the steps in one method of forming a tungsten plug in accordance with this disclosure. First, a contact hole is formed in the insulator layer of a substrate to expose a portion of a conductive layer or active layer of the device on which the insulator layer has been deposited. Next, titanium and titanium nitride layers are applied to the substrate. The coated substrate is then optionally subjected to rapid thermal annealing. Then a nucleation or seed layer of $WSi_x$ is applied by silane reduction of tungsten hexafluoride at a relatively low pressure. Layered deposition of tungsten within the contact hole is then begun by depositing a first layer of tungsten by hydrogen reduction of tungsten hexafluoride at a fast rate of deposition. Then a second layer of tungsten is deposited by hydrogen reduction at a slower rate of deposition. The contact hole is at least substantially filled with successive layers of tungsten deposited by hydrogen reduction of tungsten hexafluoride at alternating fast and slow rates of deposition. Suitable conditions for performing the various steps set forth in FIG. 2 are set forth below and will be explained by reference to FIGS. 3A–D.

Figure 3A:
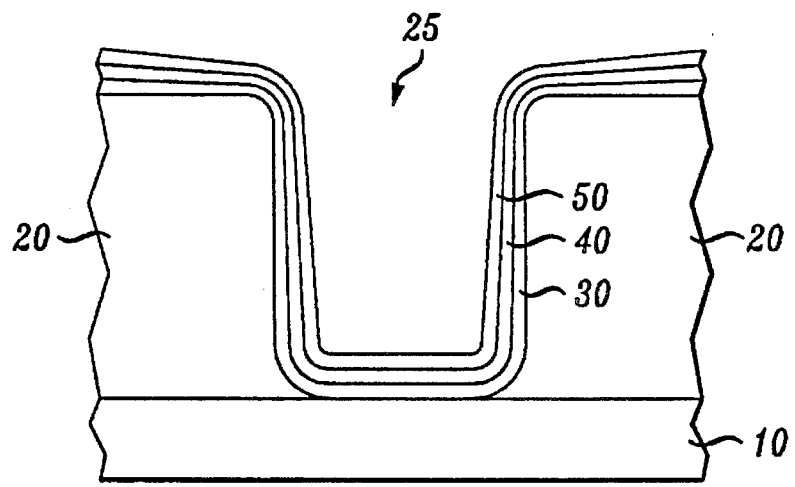
FIGS. 3A–3D are schematic representations of structures at various stages during the formulation of a layered tungsten plug in accordance with the methods of this disclosure.

Referring to FIG. 3A, a substrate useful in forming a layered semiconductor device is shown wherein a first conductive layer 10 has an insulator layer 20 formed thereon. Insulator layer 20 can be made from any typical and well-known dielectric material used in wafer fabrication, but is preferably PETEOS.SiO$_2$.

A contact hole 25 extending down to the first conductive layer 10 is formed in insulator layer 20 using known photolithographic techniques. Since the contact hole extends down to a conductive layer, it will be appreciated by those skilled in the art that the structure shown in FIGS. 3A–D is used to form a tungsten plug at the via level. It should be understood, however, that tungsten plugs can also be formed at the window level using the methods disclosed herein.

A titanium film 30 is deposited on the exposed surfaces. Titanium film 30 can be applied, for example, using a vacuum deposition technique, e.g., sputtering (with or without collimation). The thickness of titanium film can be in the range of about 50 Å to about 750 Å, preferably 500–600 Å.

A titanium nitride (TiN) film 40 is then deposited on all exposed surfaces of titanium film 30. Titanium nitride film 40 can be formed using any known technique such as a reactive sputtering process (with or without collimation) wherein sputtering is carried out in Ar+N$_2$ atmosphere using a Ti target. The thickness of titanium nitride film 40 can be in the range of about 50 Å to about 1500 Å, preferably from 600 Å to about 1200 Å. TiN film 40 serves as an adhesion layer, facilitating deposition of tungsten onto the substrate.

The substrate is then placed into a chamber and heated to a temperature of about 400°–430° C. Prior to beginning the tungsten deposition process, rapid thermal annealing (RTA) of the titanium/titanium nitride coated substrate can be carried out. RTA can be accomplished by exposing the coated substrate to temperatures of 600°–800° C. at the window level or 450° to 550° C. at the via level for a period of time ranging from 5 to 60 seconds. The particular time and temperature employed will vary based on a number of factors including the thickness of the titanium and titanium nitride layers. In a particularly useful embodiment, substrates containing titanium nitride layers less than 600 Å thick can be annealed at 550° C. for 20 seconds. While not wishing to be bound to any theory, it is believed that RTA tends to cure pinhole defects in the titanium nitride layer, thereby reducing the likelihood of volcano growth during tungsten deposition. It should be understood that annealing is an optional step.

The TiN surface is then optionally passivated by bringing silane (SiH$_4$) gas into contact with the TiN surface. Specifically, the Ti/TiN coated substrate is placed within a vacuum chamber and silane is introduced into the chamber at a flow rate ranging from 75 to 300 standard cubic centimeters per minute ("SCCM") for anywhere from 25 to 150 seconds. Preferably, the passivation process produces a discontinuous monolayer of silicon (not shown) on the titanium nitride layer.

After passivation, a nucleation layer is formed by performing WF$_6$ reduction by SiH$_4$ at relatively low pressures. During the nucleation step, the flow of silane into the chamber is in the range of 75 to 300 SCCM and the flow of WF$_6$ into the chamber is in the range 35 to 300 SCCM. Preferably, the ratio of SiH$_4$: WF$_6$ flow rates is from about 6:1 to 4:1. Hydrogen (H$_2$) gas is also introduced into the chamber during nucleation at a rate of from 1000 to 6000 SCCM, preferably from 1500 to 3000 SCCM. The duration of the nucleation step is from 10 to 150 seconds at pressure ranging from 0.1 to 1.0 Torr. The temperature is during nucleation should be maintained between about 400°–450° C., preferably 420°–430° C. The nucleation step is believed to provide a WSi$_x$ seed layer 50 on the passivated TiN surface (See FIG. 3A). While seed layer 50 is shown in FIG. 3A as a continuous layer, it should be understood that seed layer 50 can be a discontinuous layer applied to the TiN adhesion layer 40. Preferably, the thickness of seed layer 50 is up to 30 Å, more preferably 2.5 Å to 25 Å.

The flow of SiH$_4$ and WF$_6$ are then sequentially shut off and argon (Ar) and Hydrogen (H$_2$) gas are introduced into the chamber at flow rates of about 50 to about 1000 SCCM and about 3000 to about 4000 SCCM, respectively.

Rapid deposition of tungsten is then achieved by WF$_6$ reduction with H$_2$ at a relatively high total pressure. To achieve rapid tungsten deposition at rates greater than 40 Å/sec, the flow of Ar is stopped, H$_2$ is introduced into the chamber at flow rates of from 6000 to 7500 SCCM, preferably 6500 to 7000 SCCM, and WF$_6$ is introduced into the chamber at flow rates of 300 to 500 SCCM, preferably, about 400 SCCM. The total pressure during this deposition step is in the range 10 Torr to 100 Torr, preferably 20–50 Torr, most preferably 25–35 Torr. A flow rate of 400 SCCM for WF$_6$ and 3800 SCCM for H$_2$ at a total pressure of 30 torr will provide a deposition rate of about 50 Å/sec.

It should be understood that the duration of the growth phase for the first and each successive layer will depend upon a number of factors including the depth of the contact hole, the number of layers to be produced, and the actual rates of deposition used for each step. Typically, each growth phase will last for 10 seconds to 2 minutes, preferably 20 second to 1 minute, with intervening periods of no growth of the same or different duration as the growth phase.

Figure 3B:
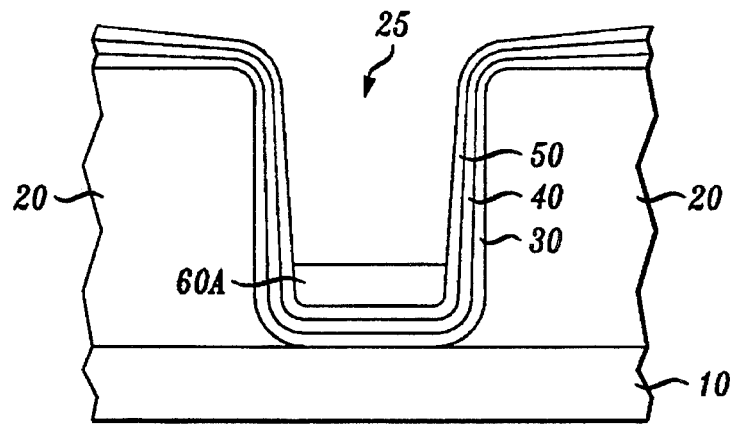
Figure 3C:
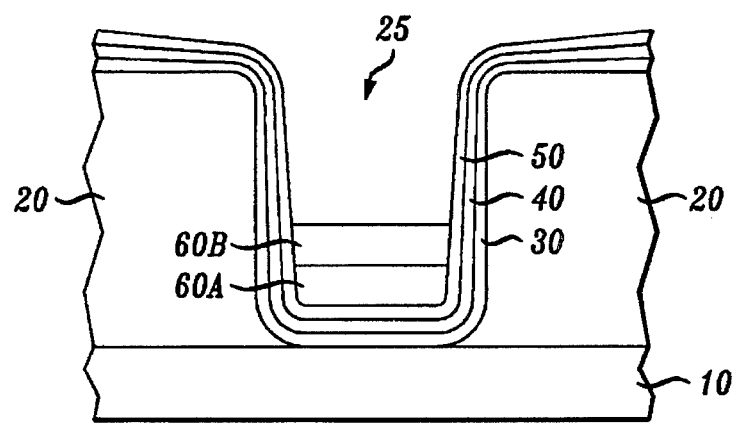

After about one minute, the flow of WF$_6$ is shut off and deposition of the first layer 60A is complete, as shown in FIG. 3B. The flow of H$_2$ is reduced to about 3000 to about 4000 SCCM, preferably about 3500 and Ar is added for about one minute.

Deposition of a second layer 60B (See FIG. 3C) of tungsten is then achieved by WF$_6$ reduction with H$_2$ at conditions which provide a relatively slow rate of deposition. To achieve slower tungsten deposition, e.g. at rates less than 40 Å/sec, the flow of Ar is stopped and H$_2$ and WF$_6$ are introduced into the chamber in the same ratio used in depositing the previous layer, but at slower flow rates. For H$_2$, flow rates of from 3000 to 5000 SCCM, preferably 3250 to 3500 SCCM are used. WF$_6$ is introduced at flow rates of 100 to 300 SCCM, preferably 150 to 250 SCCM. The total pressure during this deposition step is in the range of 10 Torr to 100 Torr, preferably 20–50 Torr, most preferably 25–35 Torr. By using flow rates of 200 SCCM for WF$_6$ and 3400 SCCM for H$_2$ at a total pressure of 30 Torr, a deposition rate of about 36 Å/sec. is obtained.

The flow of WF$_6$ is then stopped to end the second growth phase. The flow of H$_2$ is continued and Ar is added. The conditions for no growth are maintained for anywhere from 10 seconds to 2 minutes, preferably from 30 seconds to 1 minute.

Figure 3D:
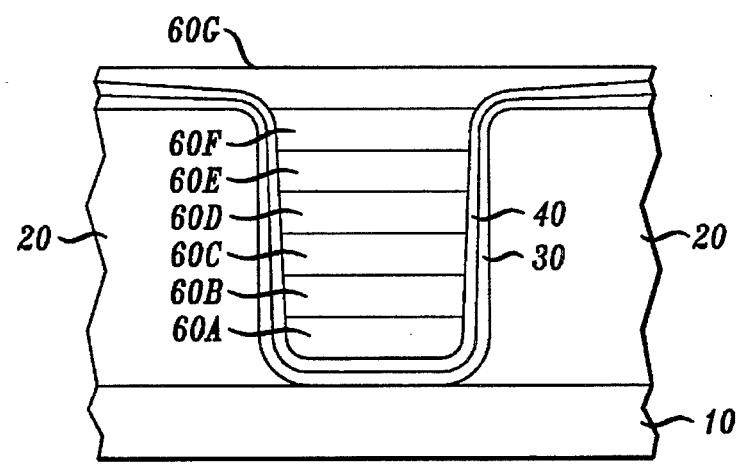

Tungsten deposition is continued in sequential alternating fast and slow growth phases for a number of times sufficient to substantially fill the contact hole. In particularly useful embodiments, the interrupted tungsten deposition is continued until at least five and preferably seven layers 60 C–G are produced and the contact hole is completely filled with a layered tungsten plug as shown in FIG. 3D. Upon completing deposition of the layered tungsten plug the seed layer 50 may no longer be noticeable. While not wishing to be bound to any theory, it is believed that the WSi$_x$ seed layer is converted to metallic tungsten during the H$_2$ reduction.

It will be understood that various modifications may be made to the embodiments disclosed herein. For example, while this disclosure has been presented in terms of a portion of a specific structure, it will be appreciated that the methods disclosed herein can be practiced on any type of device where it is necessary to make electrical contact to regions or layers under one or more insulator layers. In another example, while the first tungsten layer was deposited at a fast rate of deposition and the second tungsten layer was deposited at a slower rate of deposition, it is also possible to deposit the first tungsten layer at a slow rate and the second tungsten layer at a faster rate. Therefore, the above description should not be construed as limiting, but merely as exemplifications of preferred embodiments. Those skilled in the art will envision other modifications within the scope and spirit of the claims appended hereto.

What is claimed is:

1. A method of forming a tungsten plug comprising:
   providing a nucleation layer;
   depositing at least three successive layers of tungsten on the nucleation layer within a contact hole,
   each layer being deposited at a rate of deposition different than the rate at which the previous layer was deposited,
   the layers being alternately deposited at a fast rate of deposition of greater than 40 Å/second and a slow rate of deposition of less than 40 Å/second.

2. A method as in claim 1 wherein each of the at least three successive layers of tungsten are deposited by hydrogen reduction of tungsten hexafluoride.

3. A method as in claim 2 wherein the deposition of each layer is separated by a period of no growth lasting from about 10 seconds to about 2 minutes.

4. A method as in claim 1 wherein at least five successive layers of tungsten are deposited.

5. A method as in claim 3 wherein at least five successive layers of tungsten are deposited.

6. A method of forming an electronic device comprising:
   providing a substrate having a conductive layer, a insulator layer formed on the conductive layer and a contact hole formed in the insulator layer to expose a portion of the conductive layer;
   providing a nucleation layer;
   depositing at least three layers of tungsten on the nucleation layer within the contact hole to at least substantially fill the contact hole, the at least three layers of tungsten being deposited at a rate of deposition different than the rate at which the previous layer was deposited,
   whereby a tungsten plug capable of providing electrical connection between the conductive layer of the substrate and another conductive element is formed.

7. A method as in claim 6 wherein at least five layers of tungsten are deposited within the contact hole.

8. A method as in claim 6 wherein the step of depositing each successive layer of tungsten comprises reducing WF$_6$ with H$_2$.

9. A method as in claim 6 wherein the at least three layers of tungsten are alternately deposited at a fast rate of deposition greater than 40 Å/sec and a slow rate of deposition less than 40 Å/sec.

10. A method of forming a tungsten plug within a contact hole formed in a substrate, the method comprising:
   (a) depositing a layer of tungsten by H$_2$ reduction of WF$_6$ at a rate of deposition greater than 40 Å/sec;
   (b) depositing a layer of tungsten by H$_2$ reduction of WF$_6$ at a rate of deposition less than 40 Å/sec; and
   (c) repeating steps (a) and (b) in an alternating manner a sufficient number of times to at least substantially fill the contact hole, whereby a layered tungsten plug is formed.

11. A method as in claim 10 wherein said step (a) comprises introducing H$_2$ into a chamber containing the substrate at a flow rate of about 6000 to about 7500 SCCM and introducing WF$_6$ into the chamber at a flow rate of about 300 to about 500 SCCM, the total pressure within the chamber being from about 10 to about 100 Torr.

12. A method as in claim 10 wherein said step (b) comprises introducing H$_2$ into a chamber containing the substrate at a flow rate of about 3000 to about 5000 SCCM and introducing WF$_6$ into the chamber at a flow rate of about 100 to about 300 SCCM, the total pressure within the chamber being from about 10 to about 100 Torr.

13. A method as in claim 10 wherein the layered tungsten plug includes at least five layers of tungsten.

14. A method of forming a tungsten plug within a contact hole formed in a substrate, the method comprising:
   depositing a first layer of tungsten by H$_2$ reduction of WF$_6$ at a first rate of deposition;
   depositing a second layer of tungsten by H$_2$ reduction of WF$_6$ at a second rate of deposition, the second rate of deposition being slower than the first rate of deposition; and
   depositing a third layer of tungsten by H$_2$ reduction of WF$_6$ at a third rate of deposition, the third rate of deposition being faster than the second rate of deposition.

15. A method as in claim 14 further comprising depositing a fourth layer of tungsten by H$_2$ reduction of WF$_6$ at a fourth rate of deposition, the fourth rate of deposition being slower than the third rate of deposition; and
   depositing a fifth layer of tungsten by H$_2$ reduction of WF$_6$ at a fifth rate of deposition, the fifth rate of deposition being faster than the fourth rate of deposition.

16. A method as in claim 15 further comprising depositing a sixth layer of tungsten by H$_2$ reduction of WF$_6$ at a sixth rate of deposition, the sixth rate of deposition being slower than the fifth rate of deposition; and
   depositing a seventh layer of tungsten by H$_2$ reduction of WF$_6$ at a sixth rate of deposition, the seventh rate of deposition being faster than the sixth rate of deposition.

17. A method as in claim 16 wherein the first, third, fifth and seventh rates of deposition are greater than 40 Å/sec.

18. A method of forming an electronic device comprising:
   providing a substrate having a first layer, an insulator layer formed on the first layer and a contact hole formed in the insulator layer and exposing a portion of the first layer;
   depositing at least five layers of tungsten within the contact hole to at least substantially fill the contact hole, the at least five layers being deposited at alternating fast and slow rates of deposition.

* * * * *